(12) United States Patent  
Macri et al.

(10) Patent No.: US 8,054,928 B2  
(45) Date of Patent: Nov. 8, 2011

(54) PROGRAMMABLE PREAMBLE SYSTEM AND METHOD

(75) Inventors: Joseph D. Macri, San Francisco, CA (US); Mark Frankovich, Toronto (CA)

(73) Assignee: ATI Technologies, Inc., Ontario (CA)

( * ) Notice: Subject to any disclaimer, the term of this patent is extended or adjusted under 35 U.S.C. 154(b) by 834 days.

(21) Appl. No.: 11/273,911

(22) Filed: Nov. 14, 2005

(65) Prior Publication Data

US 2007/0110205 A1    May 17, 2007

(51) Int. Cl.
*H04L 7/00* (2006.01)
(52) U.S. Cl. ........................................ 375/356; 375/368
(58) Field of Classification Search .................. 375/356, 375/354; 327/141; 358/409; 370/503; 713/400; 714/12
See application file for complete search history.

(56) References Cited

U.S. PATENT DOCUMENTS

| 5,566,203 | A  | * | 10/1996 | Brief et al. ................... 375/211 |
| 6,600,681 | B1 |   | 7/2003  | Korger et al. |
| 2004/0022088 | A1 | * | 2/2004 | Schaefer .................. 365/189.07 |
| 2004/0052151 | A1 |   | 3/2004 | Jacobs et al. |
| 2006/0015683 | A1 | * | 1/2006 | Ashmore et al. ............... 711/113 |
| 2006/0083081 | A1 | * | 4/2006 | Park et al. ..................... 365/191 |
| 2007/0042758 | A1 | * | 2/2007 | Bozzone ....................... 455/413 |

* cited by examiner

*Primary Examiner* — Davids C. Payne  
*Assistant Examiner* — Brian J Stevens  
(74) *Attorney, Agent, or Firm* — Volpe and Koenig, P.C.

(57) ABSTRACT

A system includes a first communication device and a second communication device. The first communication device includes a programmable region. The programmable region of the first communication device is programmed so that an associated signal includes a number of preamble cycles. The second communication device also can include a programmable region. The programmable region of the second communication device can be programmed so that an associated signal includes a number of preamble cycles. The number of preamble cycles can be based on a variety of factors, such as the topology or implementation of the system. In an embodiment, the number of preamble cycles is associated with a data strobe signal, and data is not read or written in response to the data strobe signal until all of the preamble cycles have been transmitted and received.

15 Claims, 7 Drawing Sheets

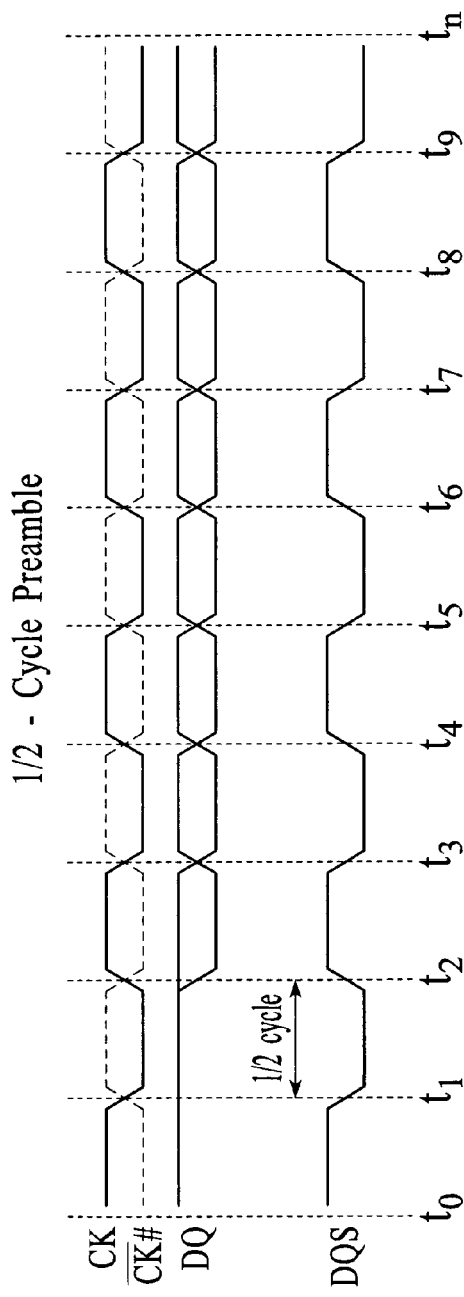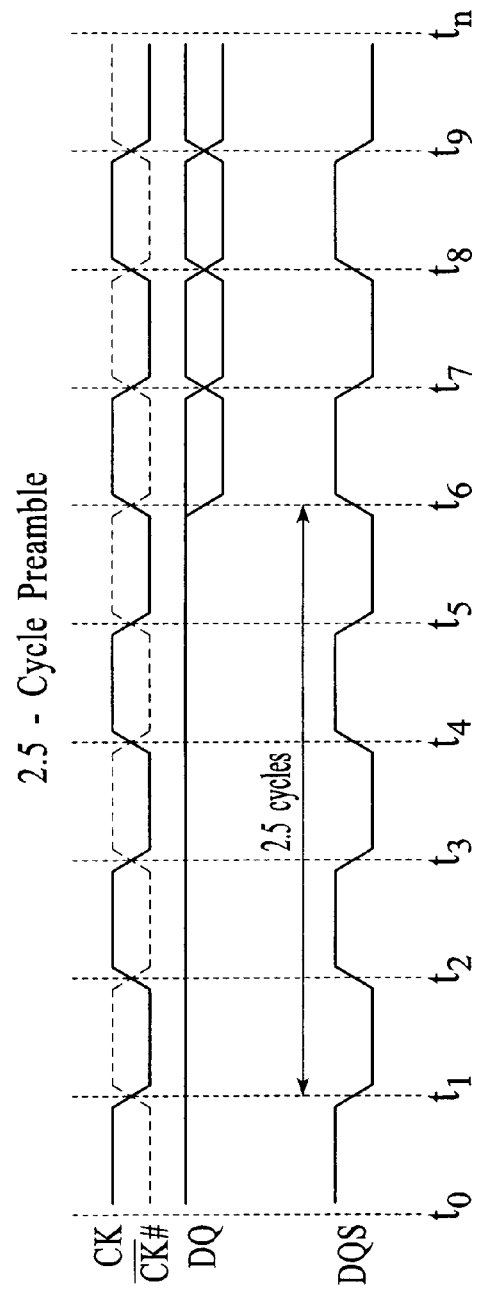

PROGRAMMABLE PREAMBLE SYSTEM AND METHOD

BACKGROUND

Various communication phenomena can affect the integrity of communicated signals in a digital communication system. For example, intersymbol interference (ISI) can compromise the integrity of transmitted data when communicating digital signals in a computing system. ISI can create overlap of individual signal pulses (or interference between symbol intervals) which tends to prevent reliably ascertaining changes of state between individual signal elements. For example, for a system with insufficient channel bandwidth, signal pulses can spread and overlap into adjacent pulse intervals and thereby cause ISI. Improper filtering of a signal pulse can result in the signal pulse spreading and overlapping into adjacent pulse intervals and thereby cause ISI. Additionally, signals transmitted over a communication path that has been in an idle or direct current (DC) state prior to signal transmission can suffer distortion due to characteristics of the path (e.g. the length of the path, proximity to other paths, etc.). At certain thresholds, these and other communication phenomena can compromise the integrity of the communicated data.

BRIEF DESCRIPTION OF THE DRAWINGS

FIG. 3A is a signal timing diagram illustrating a ½ cycle preamble which is associated with a data strobe signal (DQS), according to an embodiment.

FIG. 3B is a signal timing diagram illustrating a 2½ cycle preamble associated with a DQS, according to an embodiment.

DETAILED DESCRIPTION

Embodiments of a system and method in which one or more preamble cycles associated with a signal can be programmed into programmable regions of a communication device are described. The number of preamble cycles is used to first condition a communication path before a signal, such as a data strobe signal and/or an associated data signal are communicated between communication devices. The programmability of the programmable regions of the first and second communication devices enables a determination and selection of a number preamble cycles based on the topology and/or use of a system. The ability to determine and program a number of preamble cycles associated with a communicated signal enables communications between communication devices to be experience less data errors for a given system topology and/or implementation.

According to an embodiment, a system includes a first communication device, such as a memory controller, and/or a second communication device, such as a memory device. A first communication device includes a programmable region, such as a programmable register. A second communication device can also include a programmable region, such as a programmable register. An interface is used to program the programmable region so that a signal can be programmed to have a desired number of preamble cycles based on the topology and/or other implementation of the system. According to an implementation, the first communication device can program the programmable region of the second communication device so that a number of preamble cycles are associated with a signal. The programmed number of preamble cycles can be communicated before certain signal communication operations, such as read, write, and other operations. The programmed preamble cycles are used to condition a communication path before certain operations take place, which reduces the occurrence of communication phenomenon that cause data errors.

Figure 1:
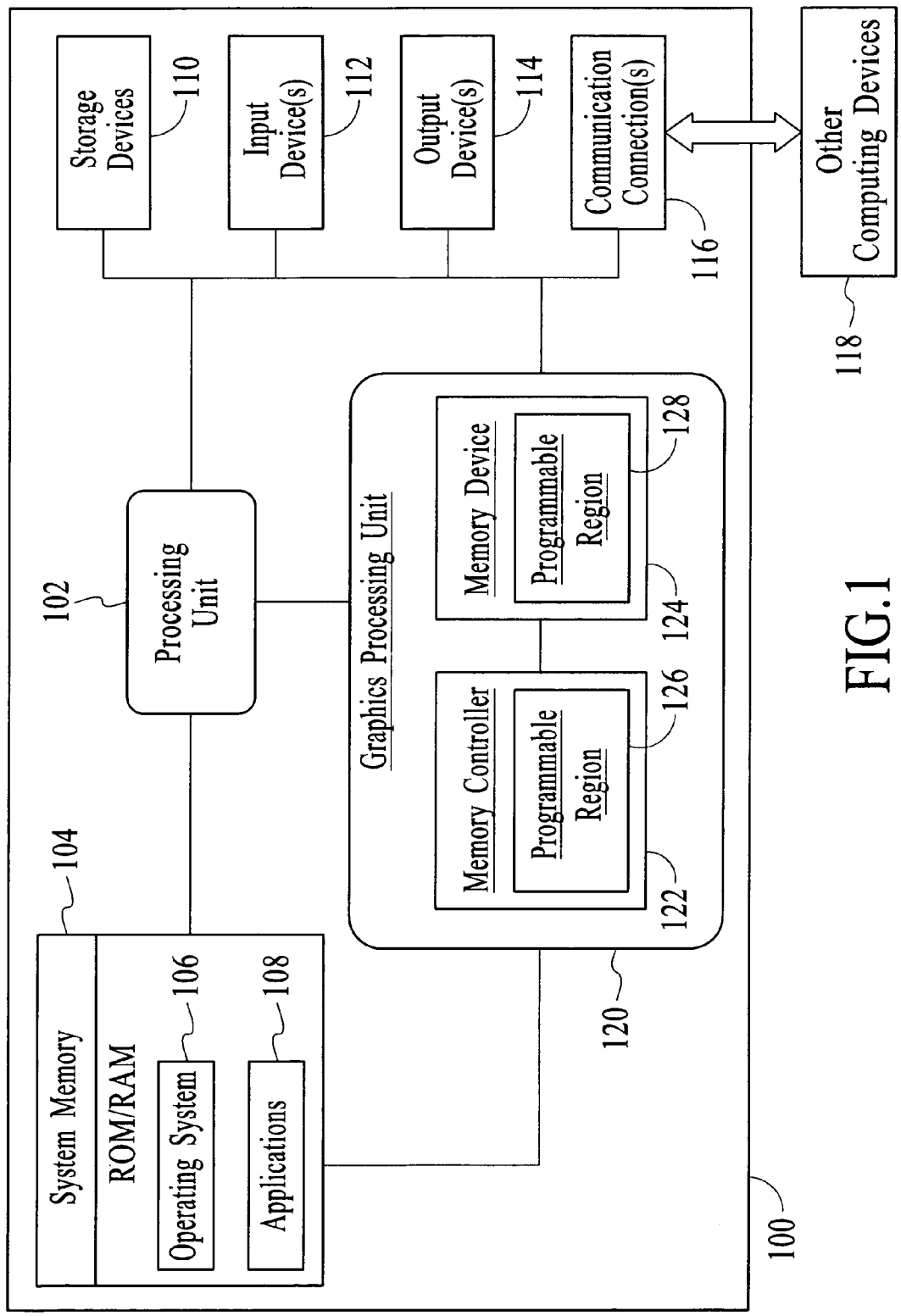
FIG. 1 is a block diagram of computing system including a graphics processing unit (GPU) having a memory controller and memory device, according to an embodiment.

FIG. 1 is a block diagram illustrating components of a computing device 100, according to an embodiment. The computing device 100 includes any computing system, such as a handheld or mobile computing system, a desktop computing system, a laptop computing system, and other such systems. The computing device 100 typically includes at least one processing unit 102 and system memory 104. Depending on the configuration and type of computing device, system memory 104 may be volatile (such as RAM), non-volatile (such as ROM, flash memory, etc.) or some combination. The system memory 104 can include an operating system 106, and one or more applications 108, such as a graphics application for example.

Computing device 100 may also include additional computer storage devices 110, for example, magnetic storage devices, optical storage devices, etc. Computer storage devices includes, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store information. Computing device 100 may also include one or more input devices 112, such as keyboard, mouse, pen, audio or touch input device, etc, and one or more output devices 114, such as a display, speakers, printer, etc. may also be included. Computing device 100 may also contain communication connections 116 that allow the device to communicate with other computing devices 118 and systems, such as over a wireline and/or wireless network.

The computing device 100 also includes a graphics processing unit (GPU) 120. According to an embodiment, the GPU 120 includes a memory controller 122 and a memory device 124. The operation and functionality of the memory controller 122 and memory device 124 are described below. The GPU 120 can include multiple memory controllers and/or memory devices, and the embodiments and examples described herein are not intended to be limiting. In an alternative embodiment, the memory controller 122 and the memory device 124 are components of an application specific integrated circuit (ASIC), which are separate from, but in communication with, the GPU 120 and other components of computing device 100.

As shown in FIG. 1, the memory controller 122 includes a programmable region 126, such as an N-bit programmable register. The memory device 124 also includes a programmable region 128, such as an N-bit programmable register. As described below, the programmable region 126 of the memory controller 122 can be programmed so that a signal associated therewith includes a number of programmable preamble cycles. Likewise, the programmable region 128 of the memory device 124 can be programmed so that a signal associated therewith includes a number of programmable preamble cycles. According to an embodiment, the programmable preamble cycles are associated with a signal based on the programming of a programmable region of the memory controller 122 and/or memory device 124. As described above, the programmed preamble cycles are used to first transmitted and received to condition the communication path before a signal, such as a data strobe signal, is recognized by a receiving device, such as the memory device 124. When the programmed number of preamble cycles have been received, the data strobe is responded to in the normal manner, including reading data on data lines.

Figure 2:
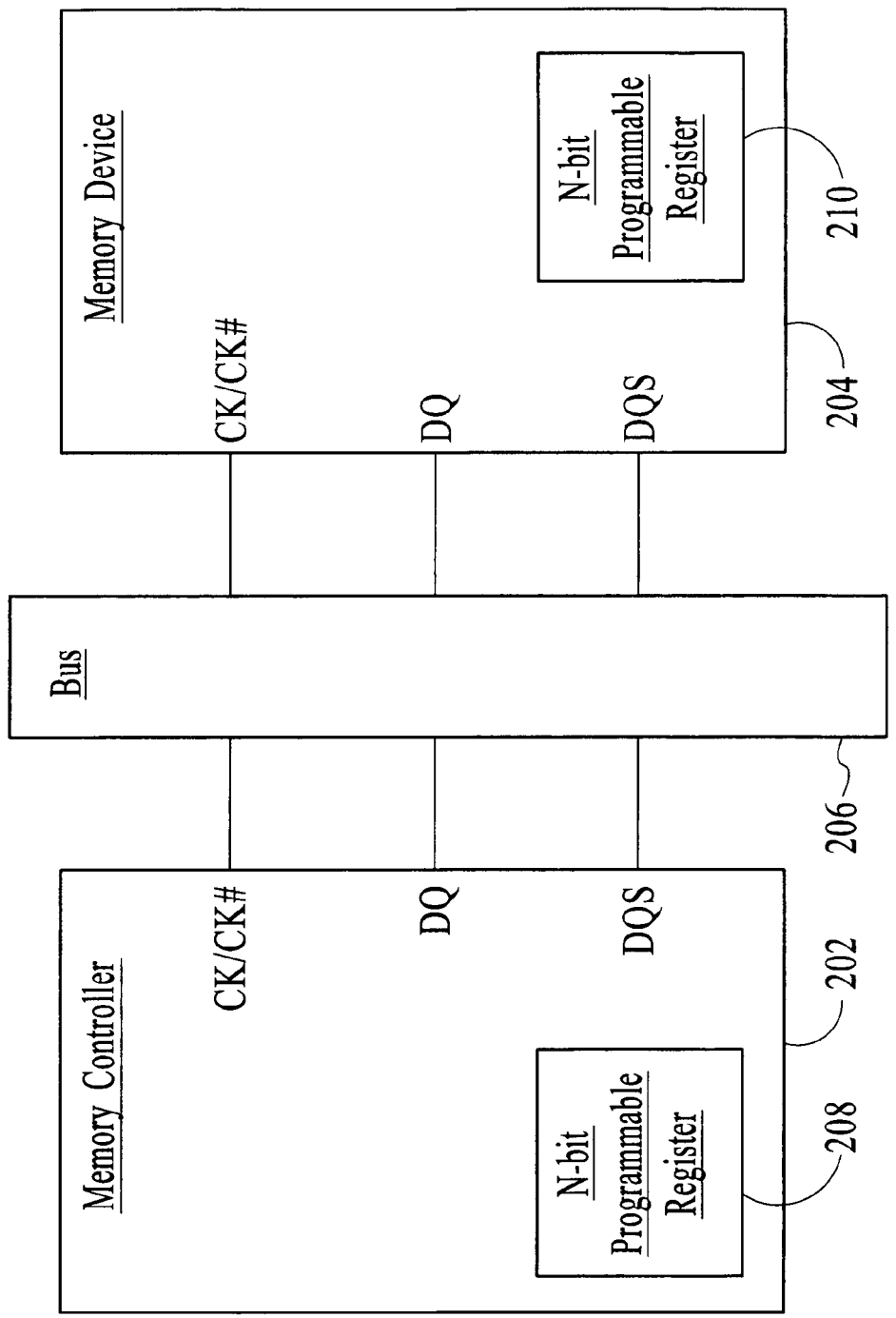
FIG. 2 is a block diagram of a memory system including a memory controller and memory device having programmable registers, according to an embodiment.

FIG. 2 is a block diagram of a memory system 200 which includes a memory controller 202 and a memory device 204, such as a synchronous double data rate (DDR) dynamic random access memory (DRAM) device for example. As described below, the memory controller 202 operates to control the memory device 204 to input and output data and other information associated with the memory system 200. While FIG. 2 shows one memory device 204 associated with the memory controller 202, appreciated that a number of other memory devices can be associated with the memory controller 202 and included in the memory system 200. According to an embodiment, the memory controller 202 and memory device 204 communicate via memory bus 206. While one communication configuration is shown in FIG. 2, other communication configurations are available and depend on a particular signal communication implementation.

The memory controller 202 includes a programmable register 208, such as an N-bit programmable register. The programmable register 208 is implemented via software, hardware, or a combination of both. The memory device 204 also includes a programmable register 210, such as an N-bit programmable register, implemented via software, hardware, or a combination of both. As described below, a number of signals can be communicated between the memory controller 202 and the memory device 204, and a programmed preamble associated with one or more of the communicated signals can reduce data errors in transmissions between the memory controller 202 and the memory device 204.

The programmable register 208 of the memory controller 202 can be programmed so that a signal associated therewith includes a number of preamble cycles. For example, a number of bits are encoded to represent a value that corresponds with a number of preamble cycles associated with a signal. The programmable register 210 of the memory device 204 also can be programmed so that a signal associated therewith includes a number of preamble cycles. The number of programmed cycles may be different for the memory controller 202 as compared to the number of programmed cycles for the memory device 204. In an alternative embodiment, only one of the memory controller 202 or the memory device 204 is programmed with a number of preamble cycles. Also, the examples shown herein include two communicating system devices. Any number of devices in a system may have a number preamble cycles programmed for communication with one or more other system devices.

As described above, a number of preamble cycles can be associated with a signal by programming the programmable register 208 of the memory controller 202 and/or programmable register 210 of the memory device 204, according to the topology of a system, including every characteristic of the transmission path. For example, the number of programmed cycles associated with a signal can be based on the digital signal communication topology of the computing device 100, memory system 200, all transmission paths between the computing device 100 and memory system 200, etc. A programming method for programming the programmable register 208 of the memory controller 202 and/or programmable register 210 of the memory device 204 is described below. In other embodiments, the number of programmable preamble cycles is available to other components of a system which can be communicated on one or more communication paths.

As another example, a number of preamble cycles associated with a signal can be programmed into the memory controller 202 based on the number and length of signal paths between the memory controller 202 and memory device 204. As another example, a number of preamble cycles associated with a signal can be programmed into the memory device 204 based on the number and length of signal paths between the memory device 202, bus 206, memory controller 202, and other memory devices. As further example, a system can automatically and dynamically program a number of preamble cycles associated with a signal based on the capacitive loading associated with a memory bus and/or other components of a system. A greater number of programmed preamble cycles associated with the signal can be included if the capacitive and/or loading exceeds a certain threshold and can be dynamically programmed based on these and other system characteristics. Likewise, a lower number of programmed preamble cycles associated with the signal can be included if the capacitive loading does not exceed a certain threshold.

According to an embodiment, the preamble of a data strobe signal (DQS) is programmed to include a number of cycles which are communicated before data is communicated between the memory controller 202 and the memory device 204. That is, after register 206 is programmed to associate a number of preamble cycles with the DQS, and the memory controller 202 issues a first command, such as a read or write command, the number of programmed preamble cycles associated with the signal are communicated before communicating valid data. This allows a communication path to be conditioned before the communication of the data signal(s). Accordingly, the number of preamble cycles are communicated before a data strobe edge associated with a valid data signal operates to communicate the data.

For example, when used to condition a data strobe signal line, a number of programmed preamble cycles tend to provide a better sampling edge when sampling data. Stated a different way, the programmed number of preamble cycles, when communicated, condition the communication path (or line) between the memory controller 202 and memory device 204, enabling a more precise sampling of the data, as compared to sampling data on a first data strobe edge without first preconditioning the communication path (see FIGS. 5-7). As described above, a number of programmed preamble cycles associated with one or more signals can be used in other communication topologies as well, and is not intended to be limited by any examples or embodiments described herein.

With continuing reference to FIG. 2, a differential clock (CK/CK#) signal is communicated between the memory controller 202 and the memory device 204, via bus 206. The differential clock (CK/CK#) signal can be provided by a separate clock driver or generated within the memory controller 202, or other system component. A data signal (DQ) and a data strobe signal (DQS) are communicated between the memory controller 202 and the memory device 204 via bus 206. According to this embodiment, a DQ and a DQS are transmitted from the memory controller 202 to the memory device 204 during writing. Correspondingly, a DQ and a DQS are transmitted from the memory device 204 to the memory controller 202 during reading. That is, the DQ and DQS are transmitted in both directions between the memory controller 202 and memory device 204.

As described above, a programmed preamble precedes a portion of a DQS when sampling data during writing and reading operations between the memory controller 202 and the memory device 204. According to an embodiment, a determination of a valid edge of the DQS can be based on a protocol or other logic. The protocol operates to determine when to sample data after the communication of the number of programmed preamble cycles of the DQS signal. The DQS functionality includes both a unidirectional, single-ended read strobe per byte, and a unidirectional, single-ended write strobe per byte, wherein a Write Data Strobe (WDQS) is center-aligned with Write Data and Read Data Strobe(RDQS) is edge-aligned with Read Data, but is not so limited and other variations exist.

FIG. 3A is a signal timing diagram illustrating a ½ cycle preamble which is associated with a DQS, according to an embodiment. While four signals are shown in FIG. 3A, it will be appreciated that other signals can be included or excluded. The ½ cycle preamble is shown to be measured from a falling edge of DQS to a first valid DQ communication at time $t_2$. For example, the ½ cycle preamble is implemented by programming an N-bit programmable register to provide the ½ cycle preamble. The programming can yield a number of corresponding cycles, such as a ½ cycle and other preamble variations. As shown in FIG. 3A, a communication of valid data occurs at $t_2$, which is preceded by the ½ cycle preamble. Accordingly, an N-bit programmable register has been programmed so that a signal (DQS) associated therewith includes a ½ cycle preamble. The programming can be based on binary logic or other logical associations.

The memory system 200 of FIG. 2 will be referenced to assist with the description of FIG. 3A. As shown in FIG. 3A, at or before time ($t_0$), the DQS is in an idle or DC state. Consequently, if data is communicated on an initial sampling edge of the DQS (say at time ($t_1$)), the sampling may result in an imprecise signal communication. The initial sampling edge may be distorted in time since the communication path has been idle for some period of time. As described above, the cycled transitions of an N-cycle programmed preamble as part of the DQS (or other signal) tend to condition the signal communication path, which provides a better sampling edge for communicating signals, such as data signals.

At time ($t_1$), the memory controller 202 has issued a command, such as a read or write command, for example. As described above, a ½ cycle preamble associated with the DQS is implemented by programming a programmable register, such as the programmable register 206 of the memory controller 202 and/or the programmable register 208 of the memory device 204. At time $t_2$ the programmed ½ cycle has been transmitted and received and the rising edge of the DQS at that time is used to sample valid data (see DQ). While it is shown that the data is first sampled on a rising edge of the DQS, data can be sampled on other portions of the DQS, such as center, falling edge, etc. According to an embodiment, the memory system 200 can include a counter and comparator for determining when a valid edge of DQS is available, but is not so limited. It will be appreciated that the number of cycles programmed can be different for the memory controller 202 and the memory device 204, and is based on a topology or other requirements, as described above. Moreover, it is also possible to program preamble cycles just for signals transmitted or received by the controller 202, the memory device 204, or other system component.

FIG. 3B is a signal timing diagram illustrating a 2½ cycle preamble which is associated with a DQS according to an embodiment. The 2½ cycle preamble is shown to be measured from a falling edge of a DQS to a first valid DQ communication at time $t_6$. For example, the 2½ cycle preamble is implemented by programming an N-bit programmable register to provide the 2½ cycle preamble. As described above, the programming can yield a number of corresponding cycles, such as a 2½ cycle and other preamble variations. As shown in FIG. 3B, a communication of valid data occurs at $t_6$, which is preceded by the 2½ cycle preamble. Accordingly, an N-bit programmable register has been programmed so that a signal (DQS) associated therewith includes a 2½ cycle preamble.

Again, the memory system 200 of FIG. 2 will be referenced to assist with the description of FIG. 3B. As shown in FIG. 3B, at or before time ($t_0$), the DQS is in an idle or DC state. Consequently, if data is communicated on an initial sampling edge of the DQS (say at time ($t_1$)), the sampling may result in a less than ideal signal communication. The initial sampling edge may be distorted in time since the communication path has been idle for some period of time. As described above, the cycled transitions of an N-cycle programmed preamble as part of the DQS tend to condition the signal communication path, which provides a better sampling edge for communicating signals, such as data signals.

At time ($t_1$), the memory controller 202 has issued a command, such as a read or write command, for example. As described above, a 2½ cycle preamble associated with the DQS is implemented by programming a programmable register, such as the programmable register 206 of the memory controller 202 and/or the programmable register 208 of the memory device 204. At time $t_6$ the programmed 2½ cycle has been transmitted and received and the rising edge of the DQS at that time is used to sample data (see DQ). While it is shown that the data is first sampled on a rising edge of the DQS, data can be sampled on other portions of the DQS, such as center, falling edge, etc. It will be appreciated that the number of cycles programmed can be different for the memory controller 202 and the memory device 204, and is based on a topology or other requirements, as described above.

Figure 4:
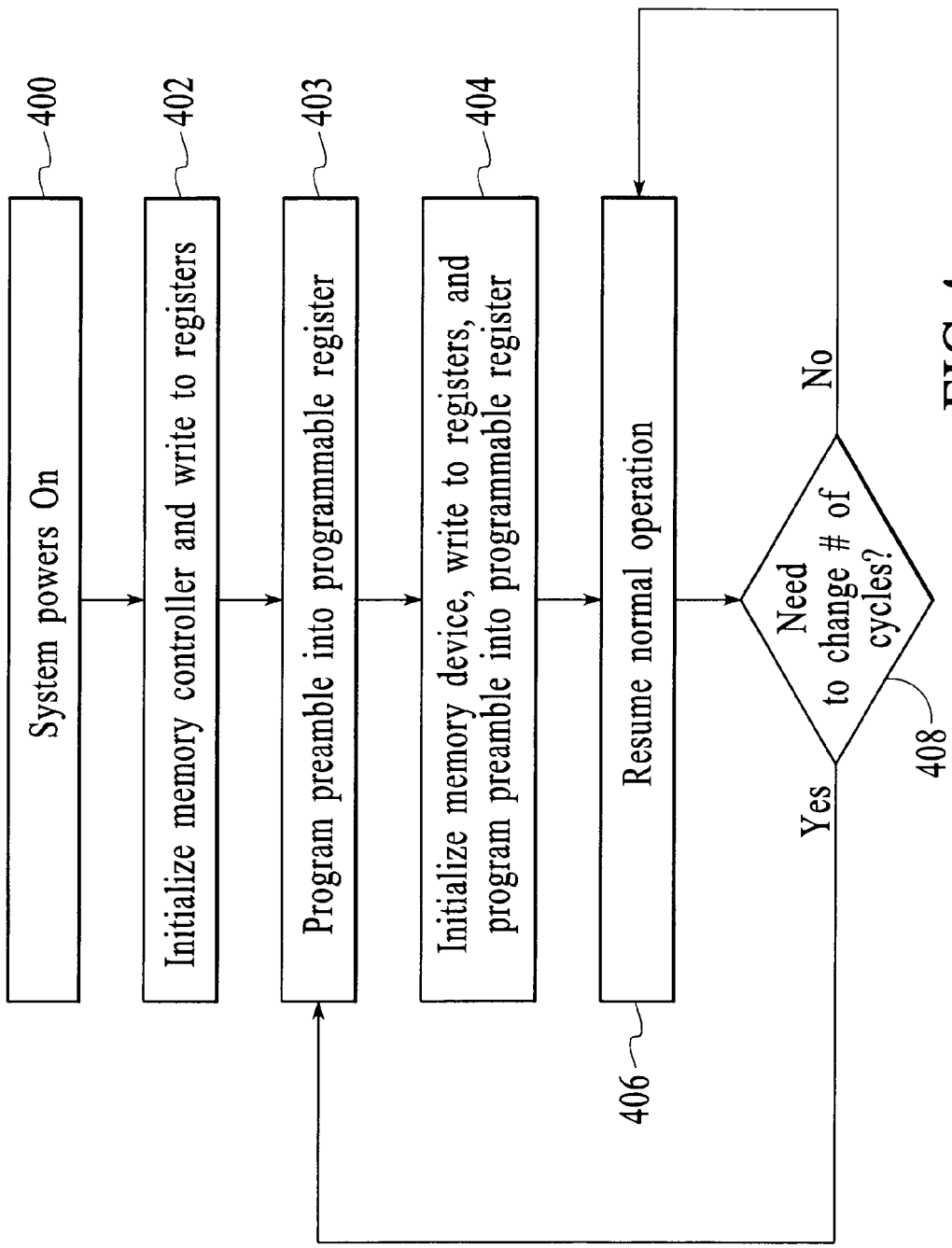
FIG. 4 is a flow diagram illustrating the programming of a programmable register to implement a preamble as part of a signal, according to an embodiment.

FIG. 4 is a flow diagram illustrating the programming of a programmable register to implement a preamble as part of a signal, such as a DQS, according to an embodiment. FIG. 2 will be used in conjunction with FIG. 4 to aid in the programming description. At 400, a system, such as computing device 100, is powered on and/or initialized. At 402, the memory controller 202 is initialized and registers are written to based on the type of associated memory and other attributes. At 403, the system also programs the N-bit programmable register 206 to associate an N-cycle preamble with a signal, such as a DQS, but is not so limited.

As described above, the programmed preamble associated with a communication signal can be based on the topology of the system or other requirements. For example, after a training or other system quantification sequence which determines the topology of the system, the basic input-output system (BIOS), module, or other device can program values into the N-bit programmable register 206 of the memory controller 202, wherein the programmed values correspond to the number of cycles that associated with the signal's preamble. For example, 3-bits of register 206 and/or 208 can be programmed to provide a DQS preamble having zero to 8-cycles. As another example, an interface, such as a programming or other interface, can be used to program the N-bit programmable register 206 of the memory controller 202 so that an associated signal includes an N-cycle preamble. The N-cycle preamble is based on a system topology or other requirements.

At 404, the memory controller 202 initializes the memory device 204 and writes to registers, which may include writes such as DLL, DOL, burst length, wait and see, etc. The memory controller 202 also can write to the N-bit programmable register 208 of the memory device 204 to program an N-cycle preamble associated with a signal, such as DQS, but is not so limited. At 406, the system resumes normal operation. At 408, after a period of time or some other criteria, the system determines if there is a need to change the number of programmed preamble cycles of the memory controller 202 and/or memory device 204. If there is a need to reprogram a number preamble cycles, the flow returns to 403. As described above, the programming can be dynamic and based on certain conditions associated with the system, such as capacitive, application load, and other system fluctuations. When the system recognizes such a condition, a different number of cycles can be programmed to compensate for the changed condition and improve signal communication. Otherwise, if there is not a need to reprogram a number preamble cycles, the flow returns to 406.

Figure 5:
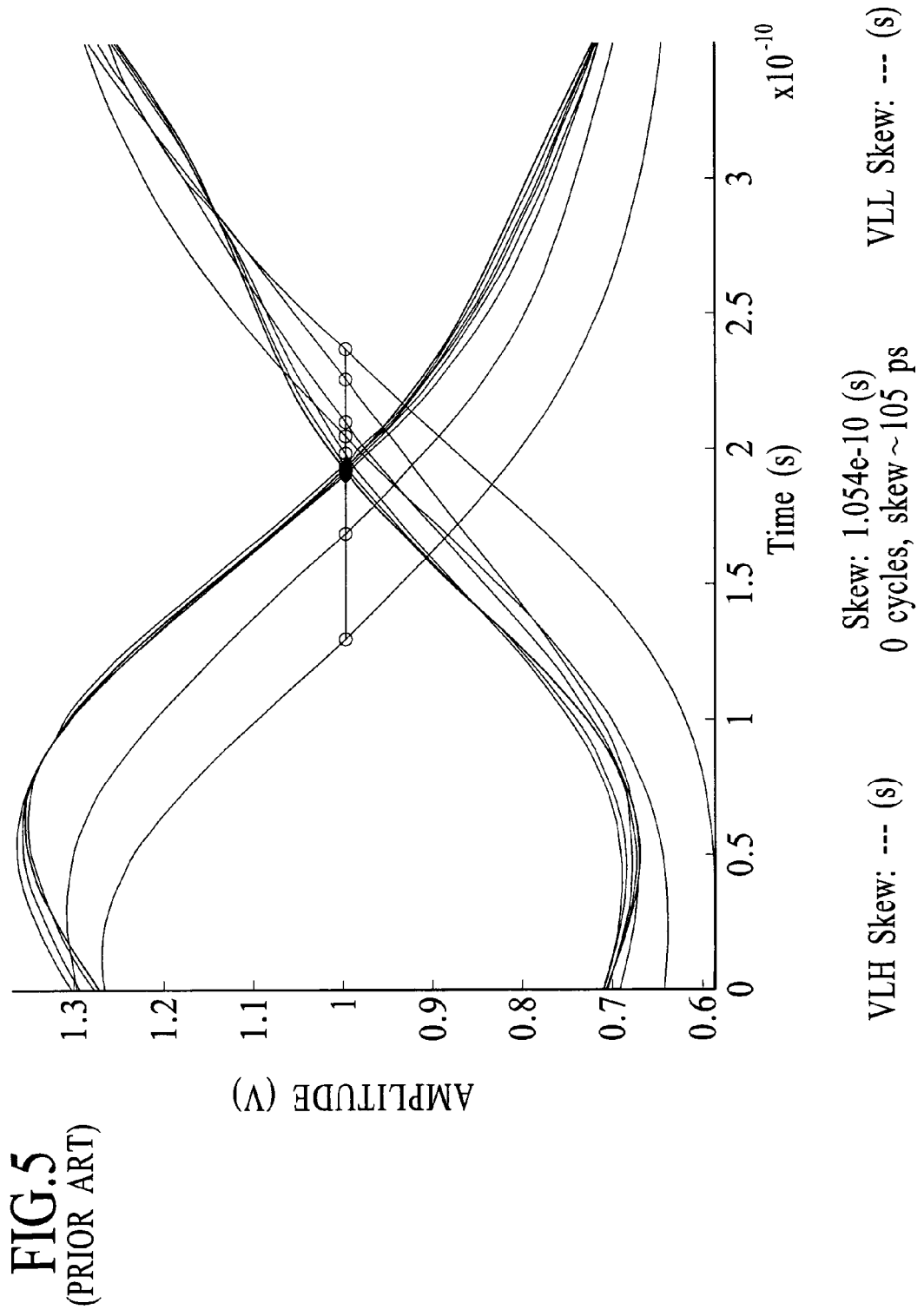
FIGS. 5-7 are half-eye diagrams which provide examples of reduction of signal skew associated with programming a number of preamble cycles which precede a signal during a signal communication.
Figure 6:
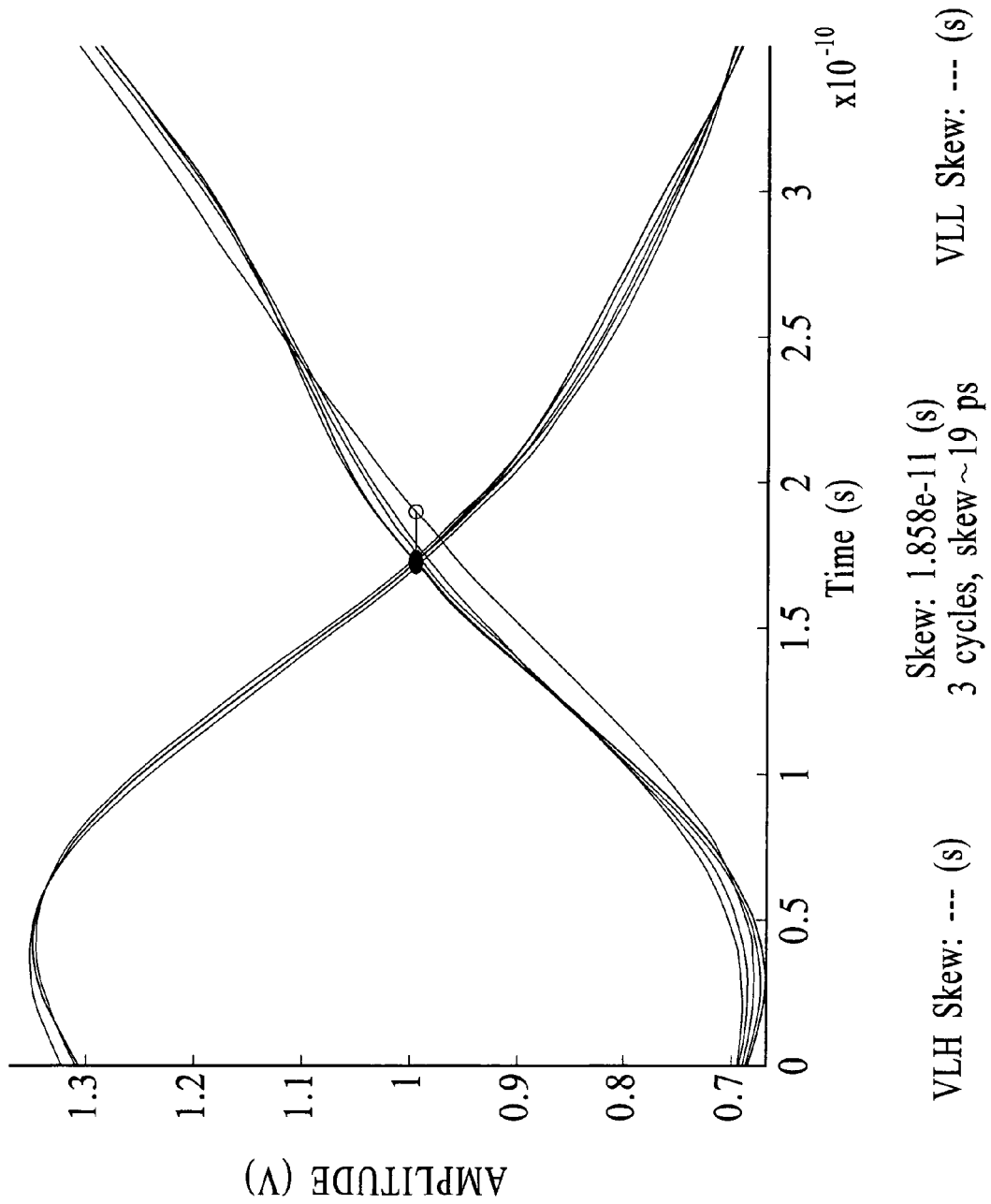
Figure 7:
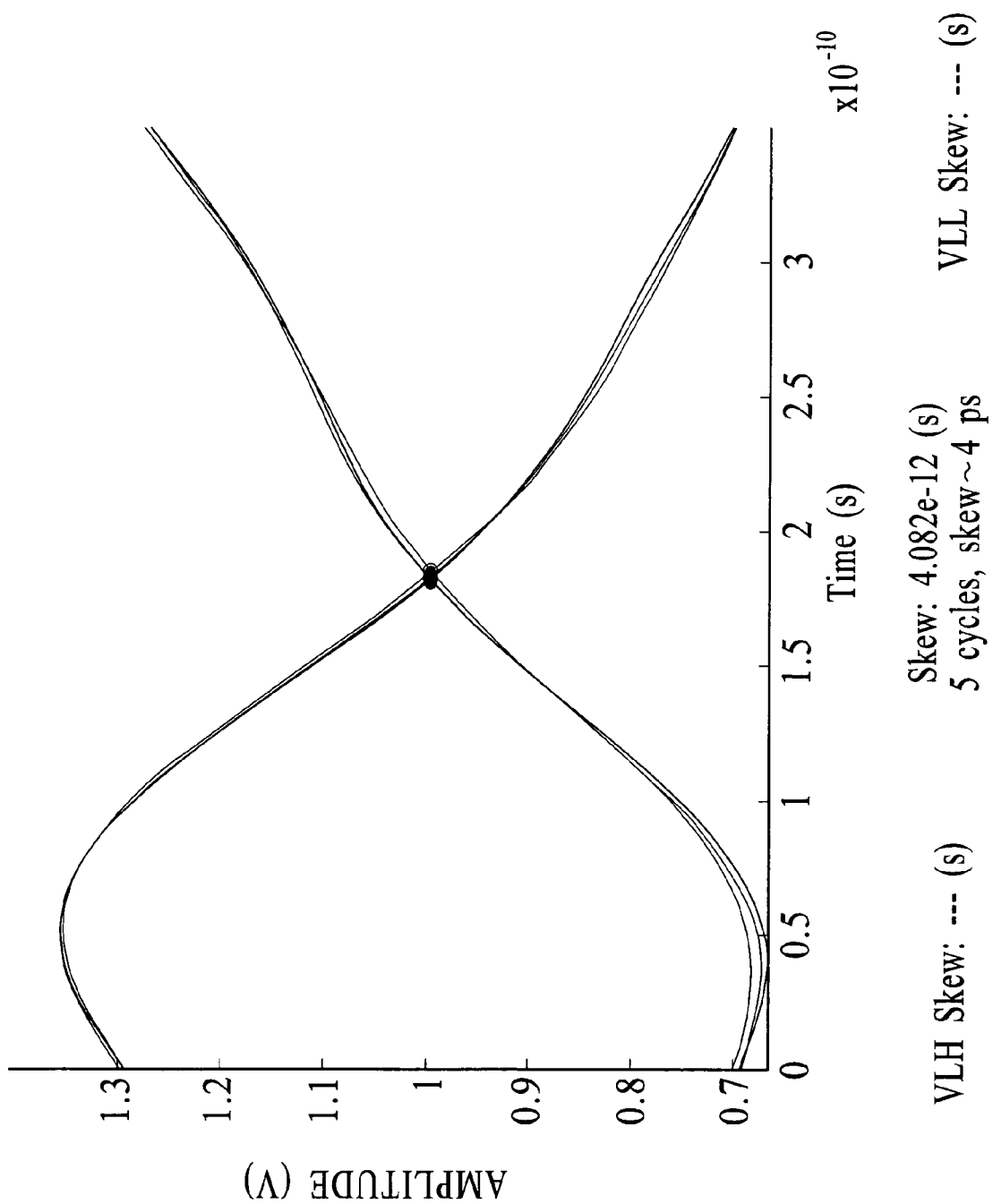

FIGS. 5-7 are half-eye diagrams which provide examples of signal skew and the effects associated with programming a number of preamble cycles which precede a signal during a signal communication. For example, a number of preamble cycles can be programmed to precede a signal before sampling occurs, such as a sampling edge of a DQS. FIG. 5 depicts about 105 picoseconds (ps) of skew between signal samples in a system with zero programmed preamble cycles. FIG. 6 depicts about 19 ps of skew between signal samples in a system having three programmed preamble cycles. FIG. 7 depicts about 4 ps of skew between signal samples in a system having five programmed preamble cycles. Thus, the examples illustrate how a number of programmed preamble cycles on a data strobe line reduce signal skew for associated data signals.

Embodiments described above may be implemented as functionality programmed into any of a variety of circuitry, including but not limited to programmable logic devices (PLDs), such as field programmable gate arrays (FPGAs), programmable array logic (PAL) devices, electrically programmable logic and memory devices and standard cell-based devices, as well as application specific integrated circuits (ASICs) and fully custom integrated circuits. Some other possibilities for implementing embodiments include: microcontrollers with memory (such as electronically erasable programmable read only memory (EEPROM)), embedded microprocessors, firmware, software, etc. Furthermore, embodiments may be implemented in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments is not intended to be exhaustive or limited by the disclosure. While specific embodiments of, and examples are described herein for illustrative purposes, various equivalent modifications are possible, as those skilled in the relevant art will recognize. The teachings provided herein can be applied to other systems and methods, and not only for the systems and methods described above. The elements and acts of the various embodiments described above can be combined to provide further embodiments. These and other changes can be made to methods and systems in light of the above detailed description.

In general, in the following claims, the terms used should not be construed to be limited to the specific embodiments disclosed in the specification and the claims, but should be construed to include all systems and methods that operate under the claims. Accordingly, the method and systems are not limited by the disclosure, but instead the scope is to be determined entirely by the claims. While certain aspects are presented below in certain claim forms, the inventors contemplate the various aspects in any number of claim forms. For example, while only one aspect is recited as embodied in machine-readable medium, other aspects may likewise be embodied in machine-readable medium. Accordingly, the inventors reserve the right to add additional claims after filing the application to pursue such additional claim forms for other aspects as well.

What is claimed is:

1. A digital communication system comprising:
a first communication device having a programmable region, and when programmed, the first communication device provides a first signal which includes a number of programmable preamble cycles, wherein the number of programmable preamble cycles associated with the first signal is based at least in part on a signal communication topology associated with the system, wherein the first communication device comprises a memory controller having a programmable register for programming the number of programmable preamble cycles; and
a second communication device in communication with the first communication device via a communication path, wherein the first signal including the number of programmable preamble cycles is communicated between the first and second communication devices and the number of programmable preamble cycles operate to condition the communication path when communicating the first signal, the second communication device also having a programmable region, and when programmed, the second communication device provides a second signal which includes a number of programmable preamble cycles, wherein the number of programmable preamble cycles associated with the second signal is based at least in part on a signal communication topology associated with the system; and
wherein the memory controller operates to communicate a data strobe signal which includes the number of programmable preamble cycles, wherein the number of programmable preamble cycles operate to condition a communication path when communicating the data strobe signal, and wherein the number of programmable preamble cycles is changeable during operation of the system based on a determination of whether a current number of programmable preamble cycles is not acceptable.

2. The system of claim 1, wherein the second communication device comprises a memory device having a programmable register for programming the number of programmable preamble cycles.

3. The system of claim 1, wherein the first communication device operates to program a programmable region of the second communication device so that a second signal includes a number of programmable preamble cycles.

4. The system of claim 1, further comprising a number of components, wherein the number of programmable preamble cycles is available to the number of components in the system, wherein the number of components utilize the number of programmable preamble cycles during a signal communication.

5. The system of claim 1, further comprising a double data rate (DDR) memory architecture, which operates to provide two data transfers per clock cycle.

6. A digital communication method, the method comprising:
   providing a first signal including a number of programmable preamble cycles from a first communication device, wherein the number of programmable preamble cycles associated with the first signal is based at least in part on a signal communication topology, wherein the first communication device comprises a memory controller having a programmable register for programming the number of programmable preamble cycles, wherein the memory controller operates to communicate a data strobe signal which includes the number of programmable preamble cycles, wherein the number of programmable preamble cycles operate to condition a communication path when communicating the data strobe signal, and wherein the number of programmable preamble cycles is changeable based on a determination of whether a current number of programmable preamble cycles is not acceptable;
   communicating the first signal including the number of programmable preamble cycles between the first and a second communication device via a communication path and the number of programmable preamble cycles operate to condition the communication path when communicating the first signal; and
   providing a second signal including a number of programmable preamble cycles from the second communication device, wherein the number of programmable preamble cycles associated with the second signal is based at least in part on a signal communication topology.

7. The method of claim 6, wherein the second communication device comprises a memory device having a programmable register for programming the number of programmable preamble cycles.

8. The method of claim 6, wherein the first communication device operates to program a programmable region of the second communication device so that a second signal includes a number of programmable preamble cycles.

9. The method of claim 6, further comprising availing the number of programmable preamble cycles to a number of components in the system, wherein the number of components utilize the number of programmable preamble cycles during a signal communication.

10. The method of claim 6, further comprising operating using a double data rate (DDR) memory architecture to provide two data transfers per clock cycle.

11. A computer-readable medium having stored thereon instructions which, when executed, communicate signals to perform a method comprising:
    providing a first signal including a number of programmable preamble cycles from a first communication device, wherein the number of programmable preamble cycles associated with the first signal is based at least in part on a signal communication topology, wherein the first communication device comprises a memory controller having a programmable register for programming the number of programmable preamble cycles, wherein the memory controller operates to communicate a data strobe signal which includes the number of programmable preamble cycles, wherein the number of programmable preamble cycles operate to condition a communication path when communicating the data strobe signal, and wherein the number of programmable preamble cycles is changeable based on a determination of whether a current number of programmable preamble cycles is not acceptable;
    communicating the first signal including the number of programmable preamble cycles between the first and a second communication device via a communication path and the number of programmable preamble cycles operate to condition the communication path when communicating the first signal; and
    providing a second signal including a number of programmable preamble cycles from the second communication device, wherein the number of programmable preamble cycles associated with the second signal is based at least in part on a signal communication topology.

12. The computer-readable medium of claim 11, wherein the second communication device comprises a memory device having a programmable register for programming the number of programmable preamble cycles.

13. The computer-readable medium of claim 11, wherein the first communication device operates to program a programmable region of the second communication device so that a second signal includes a number of programmable preamble cycles.

14. The computer-readable medium of claim 11, further comprising availing the number of programmable preamble cycles to a number of components in the system, wherein the number of components utilize the number of programmable preamble cycles during a signal communication.

15. The computer-readable medium of claim 11, further comprising operating using a double data rate (DDR) memory architecture to provide two data transfers per clock cycle.

* * * * *